United States Patent [19]
Tabira

[11] Patent Number: 5,396,129
[45] Date of Patent: Mar. 7, 1995

[54] SEMICONDUCTOR INTEGRATED CIRCUIT APPARATUS COMPRISING CLOCK SIGNAL LINE FORMED IN A RING SHAPE

[75] Inventor: Yoshihiro Tabira, Osaka, Japan

[73] Assignee: Matsushita Electronics Corporation, Osaka, Japan

[21] Appl. No.: 66,225

[22] Filed: May 25, 1993

[30] Foreign Application Priority Data

May 25, 1992 [JP] Japan .................. 4-132188

[51] Int. Cl.6 .................................... H03K 19/096
[52] U.S. Cl. ............................ 326/93; 326/21; 326/101; 327/292
[58] Field of Search ........... 307/443, 480, 481, 303.1, 307/482.1

[56] References Cited
U.S. PATENT DOCUMENTS

| | | | |
|---|---|---|---|
| 4,661,721 | 4/1987 | Ushika | 307/480 X |
| 4,851,717 | 7/1989 | Yabe | 307/443 X |
| 5,013,942 | 5/1991 | Nishimura et al. | 307/480 |
| 5,029,279 | 7/1991 | Sasaki et al. | 307/303.1 |
| 5,109,168 | 4/1992 | Rusu | 307/480 |

FOREIGN PATENT DOCUMENTS 1-184937  7/1989  Japan .
2-240712  9/1990  Japan .

Primary Examiner—David R. Hudspeth
Attorney, Agent, or Firm—Wenderoth, Lind & Ponack

[57] ABSTRACT

In a semiconductor integrated circuit apparatus, a first logic circuit processes a clock signal inputted through an external clock input terminal, and each of a plurality of second logic circuits processes the clock signal outputted from the first logic circuit, and outputs the processed clock signal to a plurality of flip-flops. In the semiconductor integrated circuit apparatus, an inner clock signal line is provided for electrically connecting the plurality of second logic circuits with the plurality of flip-flops, wherein the inner clock signal line is formed in a ring shape in the periphery of the semiconductor integrated circuit apparatus so that the plurality of flip-flops are located within the inner clock signal line, thereby reducing the clock skews therebetween in the semiconductor integrated circuit. Furthermore, an outer clock signal line is provided for electrically connecting the first logic circuit with the plurality of second logic circuits, and then the outer clock signal line is formed in a ring shape, thereby further reducing the clock skews therebetween in the semiconductor integrated circuit.

4 Claims, 6 Drawing Sheets

SEMICONDUCTOR INTEGRATED CIRCUIT APPARATUS COMPRISING CLOCK SIGNAL LINE FORMED IN A RING SHAPE

BACKGROUND OF THE INVENTION

1. Field of the Invention

The present invention relates to a semiconductor integrated circuit apparatus, and more particularly, to a semiconductor integrated circuit (referred to as an IC hereinafter) apparatus comprising at least one clock signal line formed in a ring shape for supplying a clock signal to a plurality of flip-flops, which are provided for performing various kinds of signal processing such as digital processing for processing a television signal, a video signal, or the like.

2. Description of the Prior Art

FIG. 1 shows a semiconductor IC chip 10 of a first prior art.

Referring to FIG. 1, the IC chip 10 comprises an external clock input terminal 1, a clock buffer 2, and three groups FG1, FG2 and FG3 of delay-type flip-flops FF1, FF2 and FF3 each flip-flop provided for performing various kinds of signal processing in response to an inputted clock signal. The clock signal inputted through the external clock input terminal 1 is inputted through the clock buffer 2 and clock signal lines 3 to the respective groups FG1, FG2 and FG3 of flip-flops FF1, FF2 and FF3.

In this case, since the clock signal lines 3 are formed in a branching shape or a bus shape, the respective line resistances between the output terminal of the clock buffer 2 and the input terminals of the respective flip-flops FF1, FF2 and FF3 are set to be substantially the same as each other, the respective propagation delay times required when the clock signal propagates from the clock buffer 2 to the respective flip-flops FF1, FF2 and FF3 become substantially the same as each other. This results in reduction in skews of the clock signal (referred to as clock skews hereinafter) in the IC chip 10.

FIG. 2 shows a semiconductor IC chip 11 of a second prior art, wherein the IC chip 11 comprises about 1000 and more delay-type flip-flops FF1, FF2 and FF3. In FIG. 2, the same components as those shown in FIG. 1 are denoted by the same references as those shown in FIG. 1.

Referring to FIG. 2, the clock signal inputted through the external clock input terminal 1 is divided into three clock signals on three clock signal lines 4, and then (a) the first clock signal is inputted through a clock buffer 2a to a first group FG1 of flip-flops FF1, (b) the second clock signal is inputted through a clock buffer 2b to a second group FG2 of flip-flips FF2, and (c) the third clock signal is inputted through a clock buffer 2c to a third group FG3 of flip-flips FF3.

In this case, if only one clock buffer is provided in the IC chip 11, differences among the phase delays at the respective inputs of the flip-flops FF1, FF2 and FF3 becomes too large. Therefore, the respective clock signal lines 4 extending from the external clock input terminal 1 to the respective clock buffers 2a, 2b and 2c are formed in a branching-shape so that the clock signal is divided into a plurality of clock signals through a plurality of clock buffers 2a, 2b and 2c. In this case, since the clock signal lines 4 are formed in the branching shape, the respective line resistances between the external clock input terminal 1 and the respective clock buffers 2a, 2b and 2c are set to be substantially the same as each other. This results in reduction in the clock skews in the IC chip 11.

Further, the numbers of flip-flops FF1, FF2 and FF3 included in respective ones of the groups FG1, FG2 and FG3 are set to be the same as each other, and then, the propagation delays when the clock signal propagates from the respective clock buffers 2a, 2b nand 2c to the respective flip-flops FF1, FF2 and FF3 become substantially the same as each other.

In the above-mentioned IC chip 10, forming the clock signal lines 3 for connecting the clock buffer 2 and the respective flip-flops FF1, FF2 and FF3 in the branching shape leads to reduction in the clock skews. However, when the number of flip-flops is further increased, the differences among the propagation delays of the respective clock signals supplied to the respective flip-flops become larger than a predetermined specification value since the ability of the clock buffer 2 for driving many flip-flops becomes relatively lowered. In this case, in order to eliminate the above problem, the size of the transistor of the output stage of the clock buffer 2 must be made larger. This results in an increase in the ability of the clock buffer 2 for driving the flip-flops, and then the above-mentioned differences among the propagation delays are reduced to the predetermined specification value. However, in this method, there is a limitation. Concretely speaking, there is a limitation when increasing the size of the transistor of the output stage of the clock buffer 2.

Accordingly, in order to eliminate the above-mentioned problem, there should be used a method of forming the clock signal lines 4 in the branching shape, namely, the IC chip 11 of the second prior art shown in FIG. 2 should be used.

However, if the numbers of flip-flops included in respective groups and connected to the respective clock buffers 2a, 2b and 2c are different from each other, there are caused differences among the phase delays at the respective output terminals of the clock buffers 2a, 2b and 2c due to the differences of the loads of the respective clock buffers 2a, 2b and 2c, and then there are generated clock skews at the respective input terminals of the flip-flops FF1–FF3.

As the size of the IC chip becomes larger, the number of the flip-flops included in the IC chip increases. In this case, it is extremely difficult to set the numbers of the flip-flops FF1, FF2 and FF3 respectively connected to the clock buffers 2a, 2b and 2c to be the same as each other.

SUMMARY OF THE INVENTION

An object of the present invention is therefore to provide a semiconductor IC apparatus capable of reducing the clock skews or the differences among the propagation delays at the respective flip-flops even though the number of flip-flops included in the IC apparatus increases.

In order to achieve the aforementioned objective, according to one aspect of the present invention, there is provided a semiconductor integrated circuit apparatus comprising:

an external clock input terminal for inputting a clock signal into said semiconductor integrated circuit apparatus;

a first logic circuit for performing a predetermined process for the clock signal inputted through said external clock input terminal and outputting the processed clock signal;

a plurality of second logic circuits each for performing a predetermined process for the clock signal outputted from said first logic circuit and outputting the processed clock signal;

a plurality of flip-flops each for performing a predetermined process in response to the clock signals outputted from said plurality of second logic circuits; and an inner clock signal line for electrically connecting said plurality of second logic circuits with said plurality of flip-flops;

wherein said inner clock signal line is formed in a ring shape in the periphery of said semiconductor integrated circuit apparatus so that said plurality of flip-flops are located within said inner clock signal line.

Further, the above-mentioned semiconductor integrated circuit apparatus further comprises an outer clock signal line for electrically connecting said first logic circuit with said plurality of second logic circuits, wherein said outer clock signal line is formed in a ring shape.

Furthermore, the above-mentioned semiconductor integrated circuit apparatus further comprises:

an external control input terminal for inputting a control signal into said semiconductor integrated circuit apparatus;

a first signal buffer for processing the control signal inputted through said external control input terminal and outputting the processed control signal;

a plurality of second signal buffers each for processing the control signal outputted from said first signal buffer and outputting the processed control signal to said plurality of flip-flops;

an outer control signal line for electrically connecting said first signal buffer to said plurality of second signal buffers, said outer control signal line being formed in a ring shape; and an inner control signal line for electrically connecting said plurality of second signal buffers with said plurality of flip-flops, said inner control signal line being formed in a ring shape;

wherein said plurality of flip-flops performs the predetermined process in response to the control signals outputted from said plurality of second signal buffers in addition to the clock signals outputted from said plurality of second logic circuits.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 3:
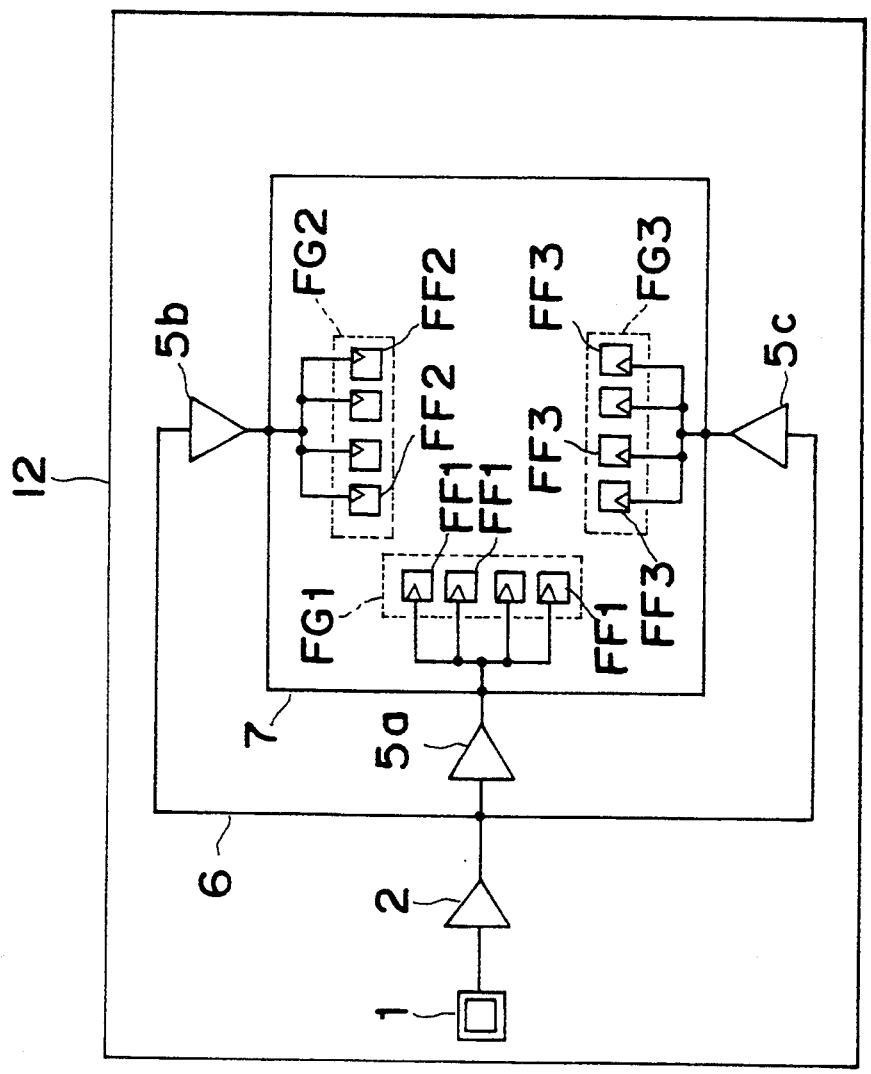
FIG. 3 is a schematic block diagram of a semiconductor IC chip 12 of a first preferred embodiment according to the present invention.
Figure 4:
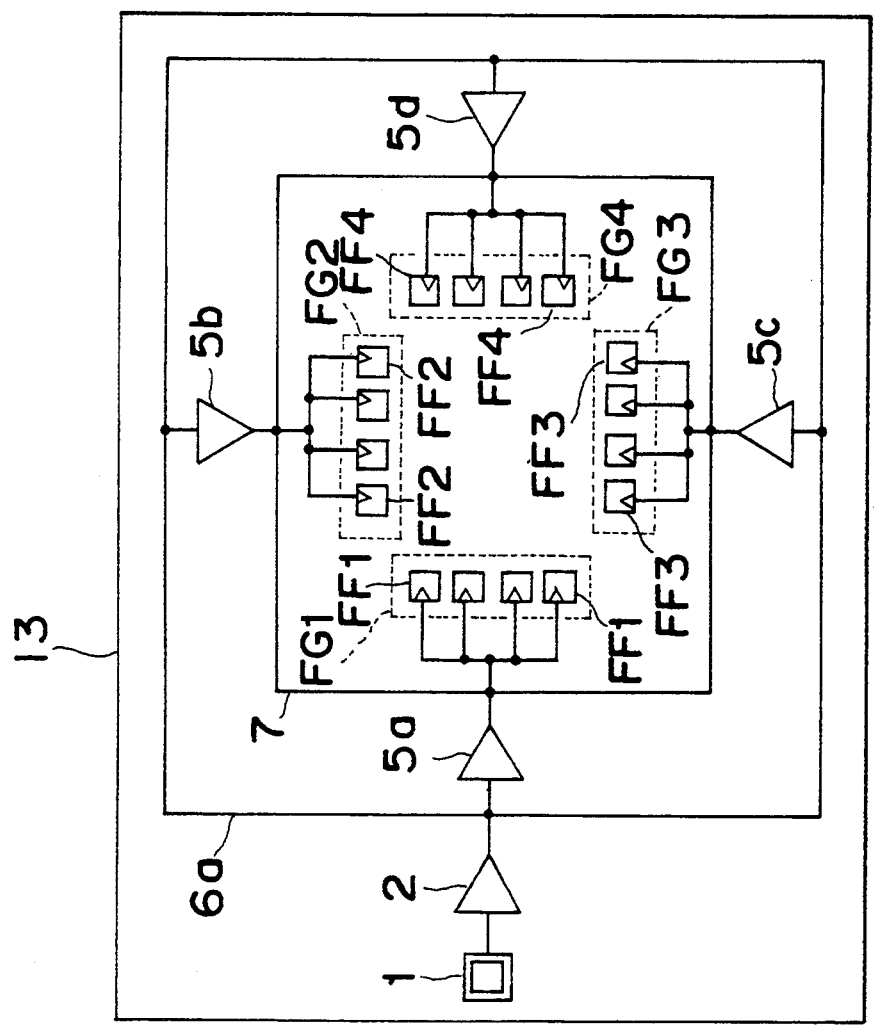
FIG. 4 is a schematic block diagram of a semiconductor IC chip 13 of a second preferred embodiment according to the present invention.
Figure 5:
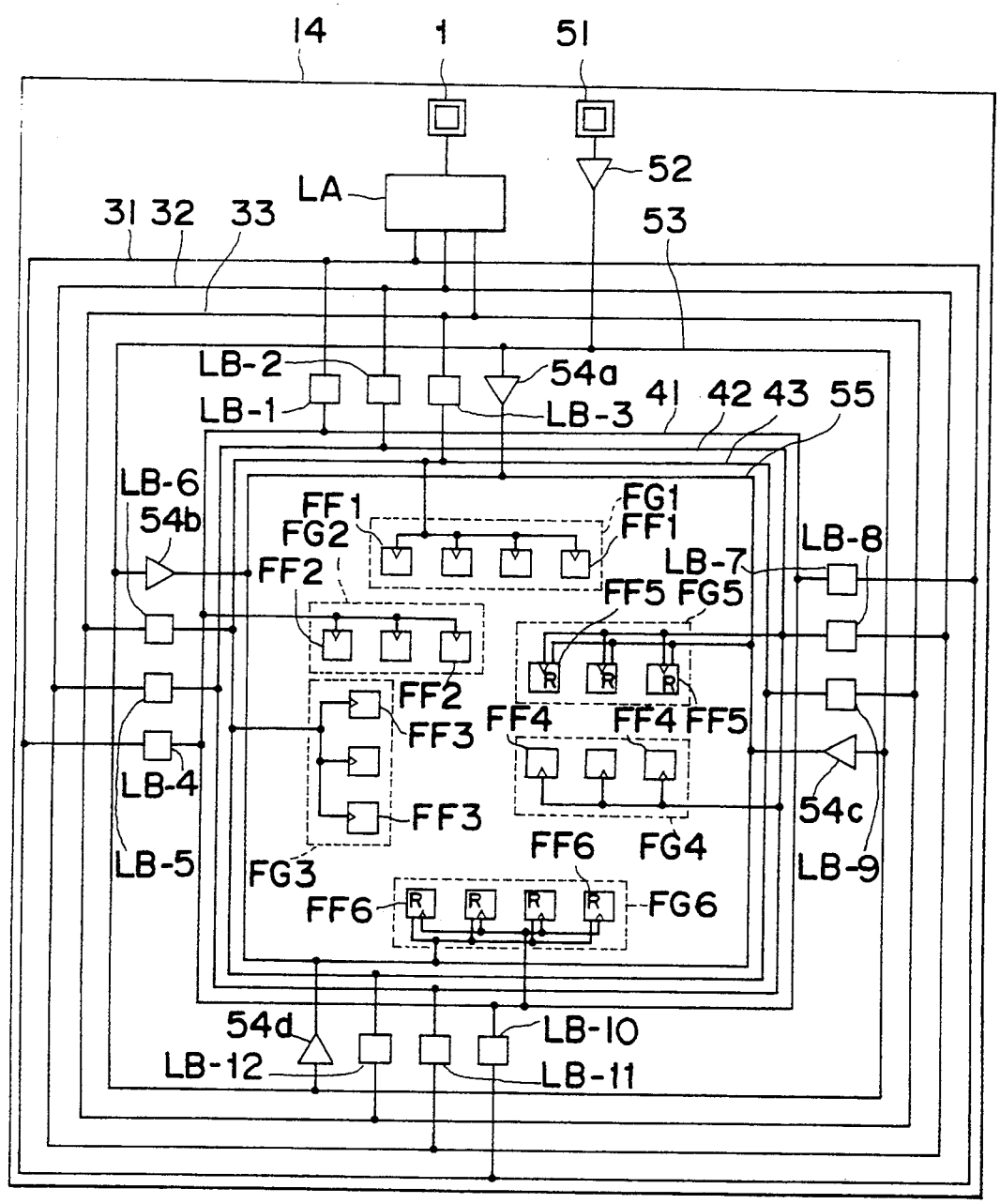
FIG. 5 is a schematic block diagram of a semiconductor IC chip 14 of a third preferred embodiment according to the present invention.

Semiconductor IC chips 12, 13 and 14 of first, second and third preferred embodiments according to the present invention will be described below with reference to the attached drawings. Each of the IC chips 12, 13 and 14 comprises a plurality of delay-type flip-flops FF1–FF6 which are provided for performing various kinds of information signal processing such as digital processings for processing a television signal, a video signal, or the like. In FIGS. 3 to 5 of the first to third preferred embodiments, information signal lines (not clock signal lines) to be processed by the delay-type flip-flops FF1–FF6 are omitted since they are not any subject matter of the present invention.

FIRST PREFERRED EMBODIMENT

Figure 1:
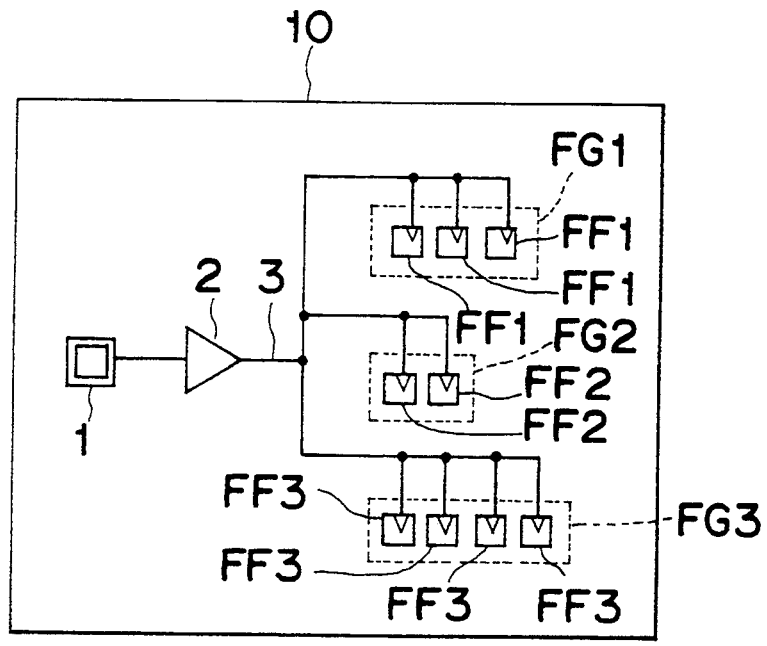
FIG. 1 is a schematic block diagram of a semiconductor IC chip 10 of a first prior art arrangement.
Figure 2:
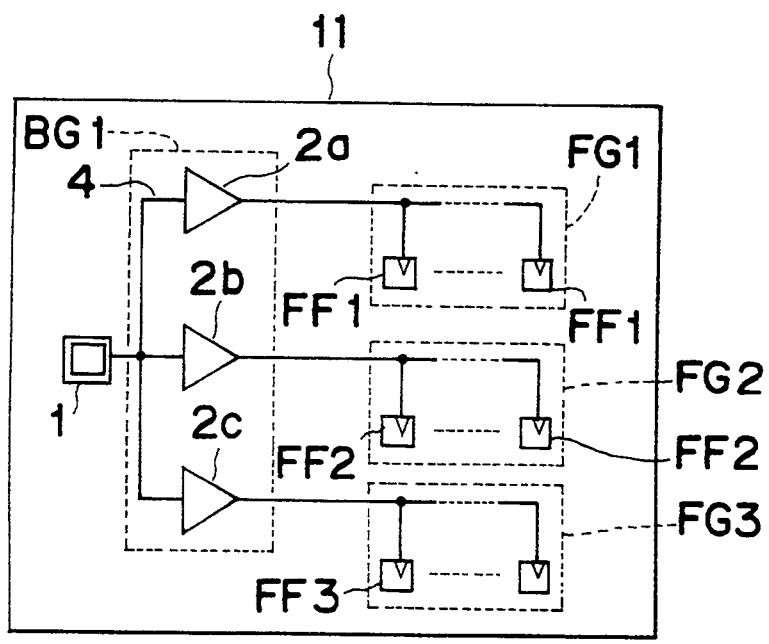
FIG. 2 is a schematic block diagram of a semiconductor IC chip 11 of a second prior art arrangement.

FIG. 3 shows the semiconductor IC chip 12 of the first preferred embodiment according to the present invention. In FIG. 3, the same components as those shown in FIGS. 1 and 2 are denoted by the same references as those shown in FIGS. 1 and 2.

Referring to FIG. 3, the IC chip 12 comprises an external clock input terminal 1, clock buffers 2, 5a, 5b and 5c each of a logic circuit for performing a buffering process of a clock signal, and three groups of delay-type flip-flops FG1, FG2 and FG3 provided in the center of the IC chip 12, wherein the first group of flip-flops FG1 comprises a plurality of delay-type flip-flops FF1, the second group of flip-flops FG2 comprises a plurality of delay-type flip-flops FF2, and the third group of flip-flops FG3 comprises a plurality of delay-type flip-flops FF3. Each of delay-type flip-flops FF1, FF2 and FF3 is provided for performing various kinds of signal processing in response to the inputted clock signal.

A clock signal inputted through the external clock input terminal 1 is inputted to the clock buffer 2, and then the clock signal outputted from the clock buffer 2 is divided into the same three clock signals through three clock signal lines 6. The divided three clock signals are respectively inputted to the clock buffers 5a, 5b and 5c, wherein the clock buffer 5a is provided at the left-center part of the IC chip 12, the clock buffer 5b is provided at the top-center part of the IC chip 12, and the clock buffer 5c is provided at the bottom-center part of the IC chip 12, namely, all the clock buffers 5a, 5b and 5c are provided at the parts near the rim portions of the IC chip 12.

The respective output terminals of the clock buffers 5a, 5b and 5c are electrically connected, through a clock signal line 7 formed in a rectangular ring shape or form, to the three groups FG1, FG2 and FG3 of flip-flops FF1, FF2 and FF3.

The clock signal outputted from the clock buffer 5a is inputted through the ring-shaped clock signal line 7 and then is divided into a plurality of clock signals, which are inputted to respective clock input terminals of the three groups FG1, FG2 and FG3 of flip-flops FF1, FF2 and FF3. Also, the clock signal outputted from the clock buffer 5b is inputted through the ring-shaped clock signal line 7 and then is divided into a plurality of clock signals, which are inputted to the respective clock input terminals of the three groups FG1, FG2 and FG3 of flip-flops FF1, FF2 and FF3. Further, the clock signal outputted from the clock buffer 5c is inputted through the ring-shaped clock signal line 7 and then is divided into a plurality of clock signals, which are inputted to the respective clock input terminals of the three groups FG1, FG2 and FG3 of flip-flops FF1, FF2 and FF3.

In the IC chip 12 shown in FIG. 3, since the clock signal line 7 is formed in a ring shape, the clock signals are inputted in a plurality of directions from a plurality of clock buffers 5a, 5b and 5c to the respective flip-flops FF1, FF2 and FF3. In other words, for example, all of the clock signals outputted from the clock buffers 5a, 5b and 5c are inputted to one flip-flop FF1. The line resistance between the respective clock buffers 5a, 5b and 5c and one flip-flop FF1, FF2 or FF3 in the IC chip 12 shown in FIG. 3 is smaller than that in each of the IC chips 10 and 11 of the prior art arrangements. This results in reduction in the propagation delay when the clock signal propagate from the clock buffer 2 to one flip-flop FF1, FF2 or FF3.

Further, since the clock signal line 7 is formed in a ring shape, the respective loads applied to the respective clock buffers 5a, 5b and 5c becomes substantially the same as each other. This results in that the phase delays due to the loads applied to the respective clock buffers 5a, 5b and 5c become substantially the same as each other.

In the case that the clock signal line 7 is not formed in a ring shape and the clock signal outputted from each of the clock buffers 5a, 5b and 5c is individually supplied to each group of flip-flops FF1, FF2 and FF3, if the numbers of the respective groups FG1, FG2 and FG3 of flip-flops are different from each other, the respective loads applied to the respective clock buffers 5a, 5b and 5c, namely, the capacitance components thereof are different from each other. This results in the shapes of the waveforms of the respective clock signals outputted from the clock buffers 5a, 5b and 5c being different from each other due to the differences of the capacitance components of the loads thereof, and then there are caused differences among the phase delays of the clock signals supplied to the respective flip-flops FF1, FF2 and FF3. In other words, there are generated the clock skews in the IC chip 12.

Since the flip-flops are divided into respective groups for respective functions of the respective groups, it is extremely difficult to set the numbers of the respective groups of flip-flops to be the same as each other in practical use.

As described above, the clock skews when the clock signal propagates from the external clock input terminal 1 to the respective groups FG1, FG2 and FG3 of flip-flops FF1, FF2 and FF3 in the IC chip 12 of the first preferred embodiment become smaller than those in the IC chips 10 and 11 of the prior art arrangement.

Further, in the first preferred embodiment, the clock signal line 7 connected to the output terminals of the clock buffers 5a, 5b and 5c is in a short-circuit state and is formed in a ring shape. This results in reduction in the differences among the phase delays of the clock signals supplied to the respective flip-flops FF1, FF2 and FF3, namely, in reduction in the clock skews of the clock signals thereof in the IC chip 12.

In the first preferred embodiment, after the clock signal on the ring-shaped clock signal line 7 is divided into a plurality of clock signals, and the respective clock signals are inputted to the flip-flops FF1, FF2 and FF3, respectively. However, the present invention is not limited to this, and the clock signal on the ring-shaped clock signal line 7 may be directly inputted to the respective flip-flops FF1, FF2 and FF3 without the division of the clock signal or without branching of the clock signals.

In the first preferred embodiment, there are provided the three clock buffers 5a, 5b and 5c. However, the present invention is not limited to this, and there may be provided at least a plurality of clock buffers in the IC chip 12.

In the first preferred embodiment, each of the clock buffers 2 and 5a–5c may be a logic circuit such as an AND gate, a clock generator or the like.

SECOND PREFERRED EMBODIMENT

FIG. 4 shows the semiconductor IC chip 13 of the second preferred embodiment according to the present invention. In FIG. 4, the same components as those shown in FIG. 3 are denoted by the same references as those shown in FIG. 3.

Differences between the IC chip 12 of the first preferred embodiment and the IC chip 13 of the second preferred embodiment are as follows: in the IC chip 13 of the second preferred embodiment, (a) there is further provided a clock buffer 5d of a logic circuit in addition to the clock buffers 5a, 5b and 5c, wherein the clock buffer 5d is provided at the right-center part near one rim part of the IC chip 13;

(b) there are further provided a group FG4 of flip-flops FF4; and (c) an outer clock signal line 6a connecting the output terminal of the clock buffer 2 with the respective input terminals of the clock buffers 5a, 5b, 5c and 5d is formed in a rectangular ring shape or form.

The features of the IC chip 13 of the third preferred embodiment are not only forming the inner clock signal line 7 in a ring shape but also forming the outer clock signal line 6a in a ring shape.

In the IC chip 13 as constructed above, the clock signal inputted through the external clock input terminal 1 is inputted to the clock buffer 2, and then the clock signal outputted from the clock buffer 2 is inputted through the ring-shaped outer clock signal line 6a to the respective clock buffers 5a, 5b, 5c and 5d. Thereafter, each of the clock signals respectively outputted from the clock buffers 5a, 5b, 5c and 5d is inputted through the ring-shaped inner clock signal line 7 to respective clock input terminals of the respective groups FG1, FG2, FG3 and FG4 of flip-flops FF1, FF2, FF3 and FF4.

The propagation delays when the clock signal propagates from the external clock input terminal 1 to the respective clock buffers 5a, 5b, 5c and 5d are about directly proportional to the dimensions of the IC chip 13. However, since the outer clock signal line 6a is formed in a ring shape, the clock signal outputted from the clock buffer 2 is inputted in the two directions to each of the clock buffers 5a, 5b, 5c and 5d. In this case, the line resistances between the clock buffer 2 and the respective clock buffers 5a, 5b, 5c and 5d become smaller than those in the case that the clock signal from the clock buffer 2 is supplied to each of the clock buffers 5a, 5b, 5c and 5d in one direction, or through respective clock signal lines formed in a branching shape and not formed in a ring shape. In the IC chip 13, among the line resistances between the external clock input terminal and the respective clock buffers 5a, 5b, 5c and 5d, the line resistance of the clock signal line extending from the external clock input terminal 1 to the clock buffer 5d located at the farthest position from the external clock input terminal 1 becomes the maximum. In the case of the clock signal line connecting the clock buffer 2 to the clock buffer 5d, the line resistance becomes about half the line resistance in the case that the output terminal of the clock buffer 2 is electrically connected through one clock signal line to the clock buffer 5d. This results in reduction in the maximum propagation delay even when taking into consideration the increase in the capacitance component of the clock signal line.

In a manner similar to that of the IC chip 12 of the first preferred embodiment, the inner clock signal line 7 is formed in a ring shape, and then the clock signal is supplied in the two directions through the ring-shaped inner clock signal line 7 to each of the flip-flops FF1–FF4. Therefore, the line resistances between the respective clock buffers 5a–5d and the respective flip-flops FF1–FF4 become smaller than those in the case that each of the clock buffers 5a–5d individually supplies the clock signal to each group FG1–FG4 of flip-flops FF1–FF4. This results in reduction in the propagation delays in the respective clock signal lines. Further, since the inner clock signal line 7 connecting the respective clock buffers 5a–5d with the respective flip-flops FF1–FF4 is formed in a ring shape, the loads applied to the clock buffers 5a–5d for supplying the clock signals to the flip-flops FF1–FF4 become substantially the same as each other. This results in that the phase delays due to the loads applied to the clock buffers 5a–5d become substantially the same as each other.

As described above, the clock skews when the clock signal propagates from the external clock input terminal 1 to the respective flip-flops FF1–FF4 in the IC chip 13 of the second preferred embodiment become smaller than those in the IC chips 11 and 12 of the prior art arrangements.

In the IC chip 13 of the second preferred embodiment, since the inner clock signal line 7 is in a short circuit state and is formed in a ring shape, then the phase delays at the respective flip-flops FF1–FF4 can be reduced, and the clock skews in the IC chip 13 can be reduced.

In the second preferred embodiment, there are provided the four clock buffers 5a–5d. However, the present invention is not limited to this, and there may be provided at least a plurality of clock buffers in the IC chip 13.

In the second preferred embodiment, each of the clock buffers 2 and 5a–5d may be a logic circuit such as an AND gate, a clock generator or the like.

THIRD PREFERRED EMBODIMENT

FIG. 5 shows the semiconductor IC chip 14 of the third preferred embodiment according to the present invention. In FIG. 5, the same components as those shown in FIGS. 3 and 4 are denoted by the same references as those shown in FIGS. 3 and 4.

As compared with the IC chips 12 and 13 of the first and second preferred embodiments, the IC chip 14 of the third preferred embodiment is characterized in comprising an external control signal input terminal 51 for inputting a control signal such as a reset signal or the like in addition to the external clock input terminal 1, and further comprising three outer clock signal lines 31–33 each formed in a rectangular ring shape, an outer control signal line 53 formed in a rectangular ring shape, three inner clock signal lines 41–43 each formed in a rectangular ring shape, and an inner control signal line 55 formed in a rectangular ring shape.

In the outer rim parts of the IC chip 14 shown in FIG. 5, there are provided the three ring-shaped outer clock signal lines 31–33 and the outer control signal line 53. In the inner parts of the IC chip 14, there are provided the three ring-shaped inner clock signal lines 41–43 and the outer control signal line 55. In an area between the outer control signal line 53 and the inner clock signal line 41, (a) there are provided logic circuits LB-1 to LB-3 and a signal buffer 54a at the top-center part thereof, (b) there are provided logic circuits LB-4 to LB-6 and a signal buffer 54b at the left-center part thereof, (c) there are provided logic circuits LB-7 to LB-9 and a signal buffer 54c at the right-center part thereof, and (d) there are provided logic circuits LB-10 to LB-12 and a signal buffer 54d at the bottom-center part thereof. Further, in the center area of the IC chip 14 located within the control signal line 55, there are provided the first group FG1 of delay-type flip-flops FF1, the second group FG2 of delay-type flip-flops FF2, the third group FG3 of delay-type flip-flops FF3, the fourth group FG4 of delay-type flip-flops FF4, the fifth group FG5 of delay-type flip-flops FF5 each flip-flop FF5 having a reset input terminal R, and the sixth group FG6 of delay-type flip-flops FF6 each flip-flop FF6 having a reset input terminal R.

The clock signal inputted through the external clock input terminal 1 is inputted through a logic circuit LA to the three outer clock signal lines 31–33.

Figure 6A:
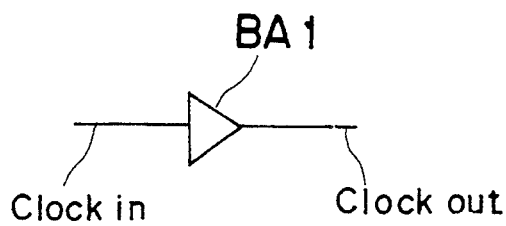
FIG. 6a is a schematic block diagram of a clock buffer BA1 which is a first example of a logic circuit LA shown in FIG. 5.

FIG. 6a shows a clock buffer BA1 which is an example of the logic circuit LA shown in FIG. 5. In this case, the clock signal is inputted to the clock buffer BA1 and then is divided into the same three clock signals, which are respectively outputted to the clock signal lines 31–33.

Figure 6B:
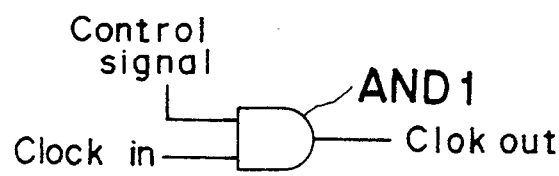
FIG. 6b is a schematic block diagram of an AND gate AND1 which is a second example of the logic circuit LA shown in FIG. 5.

The logic circuit LA may be an AND gate AND1 shown in FIG. 6b. In this case, the clock signal is gated for a predetermined time interval according to a control signal, and then is outputted as a gated clock signal. Thereafter, the gated clock signal is divided into the same three clock signals, which are respectively outputted to the clock signal lines 31–33. Further, the logic circuit LA may be a clock generator including a plurality of frequency dividers.

Figure 6C:
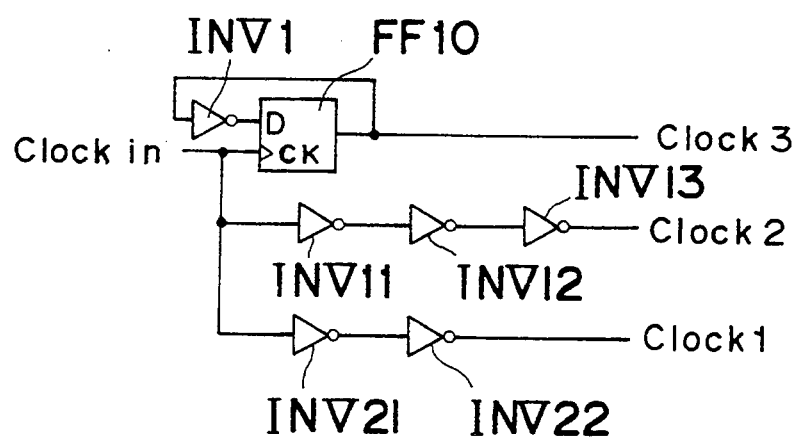
FIG. 6c is a schematic block diagram of a clock generator which is a third example of the logic circuit LA shown in FIG. 5.

Furthermore, the logic circuit LA may be a clock generator shown in FIG. 6c, which generates three kinds of clock signals of Clock 1, 2 and 3 in response to the inputted clock signal. Referring to FIG. 6c, the inputted clock signal is inputted to a clock input terminal of a delay-type flip-flop FF10, and also is passed through two inverters INV21 and INV22 and then is outputted as the Clock 1 to the clock signal line 31. Further, the inputted clock signal is passed through three inverters INV11–INV13 and then is outputted as the Clock 2 to the clock signal line 32. The signal outputted from the flip-flop FF10 is inputted through an inverter INV1 to a data input terminal D of the flip-flop FF10 and also is outputted as the Clock 3 to the clock signal line 33.

On the other hand, the control signal such as a reset signal or the like is inputted through a signal buffer 52 to the control signal line 53 formed in a rectangular ring shape.

The clock signal on the ring-shaped outer clock signal line 31 is inputted through the respective logic circuits LB-1, LB-4, LB-7 and LB-10 to the ring-shaped inner clock signal line 41, the clock signal on the ring-shaped outer clock signal line 32 is inputted through the respective logic circuits LB-2, LB-5, LB-8 and LB-11 to the ring-shaped inner clock signal line 42, and the clock signal on the ring-shaped outer clock signal line 33 is inputted through the respective logic circuits LB-3, LB-6, LB-9 and LB-12 to the ring-shaped inner clock signal line 43.

On the other hand, the control signal on the ring-shaped outer control signal line 53 is inputted through the respective signal buffers 54a, 54b, 54c and 54d to the ring-shaped inner control signal line 55.

Further, the clock signal on the ring-shaped inner clock signal line 41 is inputted to respective clock input terminals of the second group FG2 of flip-flops FF2 and the sixth group FG6 of flip-flops FF6, the clock signal on the ring-shaped inner clock signal line 42 is inputted to respective clock input terminals of the fourth group FG4 of flip-flops FF4 and the fifth group FG5 of flip-flops FF5, and the clock signal on the ring-shaped inner clock signal line 43 is inputted to respective clock input terminals of the third group FG3 of flip-flops FF3 and the sixth group FG6 of flip-flops FF6.

On the other hand, the control signal on the inner control signal line 55 is inputted to respective reset input terminals R of the fifth group FG5 of flip-flops FF5 and the sixth group FG6 of flip-flops FF6.

Figure 7A:
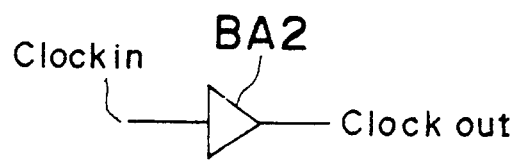
FIG. 7a is a schematic block diagram of a clock buffer BA2 which is a first example of each of logic circuits LB-1 to LB-12 shown in FIG. 5.

FIG. 7a shows a clock buffer BA2 which is an example of each of the logic circuit LB-1 to LB-12 shown in FIG. 5. Referring to FIG. 7a, the clock signal is passed through the clock buffer BA2 and then is outputted to each of the inner clock signal lines 41–43.

Figure 7B:
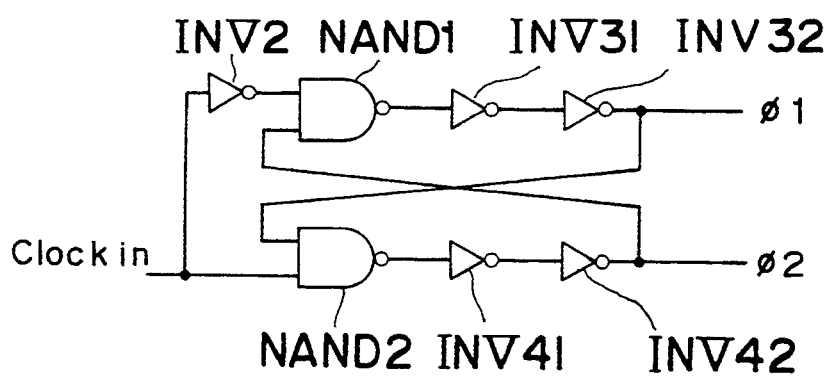
FIG. 7b is a schematic block diagram of a clock generator which is a second example of each of the logic circuits LB-1 to LB-12 shown in FIG. 5.

Each of the logic circuits LB-1 to LB-12 may be a clock generator shown in FIG. 7b, which generates two kinds of clock signals $\phi1$ and $\phi2$ in response to the clock signal outputted from the logic circuit LA. Referring to FIG. 7b, the inputted clock signal is inputted through an inverter INV2 to a first input terminal of a NAND gate NAND1, and also is inputted to a second input terminal of a NAND gate NAND2. A signal outputted from the NAND gate NAND1 is outputted through two inverters INV31 and INV32 as the clock signal $\phi1$, and the clock signal $\phi1$ is further inputted to a first input terminal of the NAND gate NAND2. A signal outputted from the NAND gate NAND2 is outputted through two inverters INV41 and INV42 as the clock signal $\phi2$, and the clock signal $\phi2$ is further inputted to a second input terminal of the NAND gate NAND1. For example, the first clock signal $\phi1$ is outputted to the inner clock signal line 41, and the second clock $\phi2$ is outputted to the inner clock signal line 42.

Figure 8:
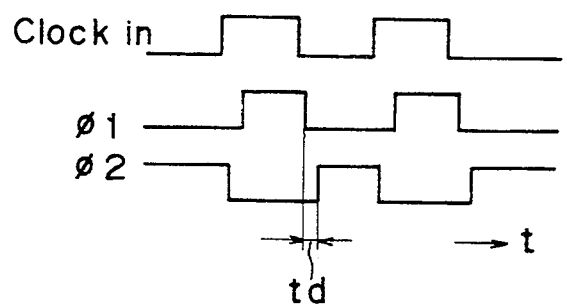
FIG. 8 is a timing chart showing an operation of the clock generator shown in FIG. 7b.

FIG. 8 is a timing chart showing an operation of the clock generator shown in FIG. 7b. In the clock generator shown in FIG. 8, the first clock signal $\phi1$ delayed by a predetermined delay time from the inputted clock signal is outputted, and the second clock signal $\phi2$ delayed by a predetermined delay time td from the trailing edge of the first clock signal $\phi1$ is outputted.

In the IC chip 14 as constructed above, one clock signal outputted from the logic circuit LA is inputted through the ring-shaped inner clock signal line 31 and the logic circuits LB-1, LB-4, LB-7 and LB-10 to the ring-shaped inner clock signal line 41, and then the clock signal on the ring-shaped inner clock signal line 41 is inputted to the respective clock input terminals of the second group FG2 of flip-flops FF2 and the sixth group FG6 of flip-flops FF6. Further, another clock signal outputted from the logic circuit LA is inputted through the ring-shaped inner clock signal line 32 and the logic circuits LB-2, LB-5, LB-8 and LB-11 to the ring-shaped inner clock signal line 42, and then the clock signal on the ring-shaped inner clock signal line 42 is inputted to the respective clock input terminals of the fourth group FG4 of flip-flops FF4 and the fifth group FG5 of flip-flops FF5. Furthermore, a further clock signal outputted from the logic circuit LA is inputted through the ring-shaped inner clock signal line 33 and the logic circuits LB-3, LB-6, LB-9 and LB-12 to the inner clock signal line 43, and then the clock signal on the ring-shaped inner clock signal line 43 is inputted to the respective clock input terminals of the first group FG1 of flip-flops FF1 and the third group FG3 of flip-flops FF3.

On the other hand, the control signal inputted through the external control signal input terminal 51 is inputted through the signal buffer 52 to the ring-shaped outer control signal line 53, and then the control signal on the ring-shaped control signal line 53 is inputted through the signal buffers 54a–54d to the ring-shaped control signal line 55. Thereafter, the control signal on the ring-shaped inner control signal line 55 is inputted to the respective reset input terminals R of the fifth group FG5 of flip-flops FF5 and the sixth group FG6 of flip-flops FF6.

Since each of the clock signal lines 31–33 is formed in a ring shape, the propagation delays when the clock signal propagates from the external clock signal input terminal 1 to the respective logic circuits LB-1 to LB-12 are set to be substantially the same as each other. This results in reduction in the clock skews between the logic circuit LA and the respective logic circuits LB-1 to LB-12 in the IC chip 14.

Further, since each of the outer clock signal lines 31–33 is formed in a ring shape and each of the inner clock signal lines 41–43 is formed in a ring shape, the propagation delays when the clock signal propagates from the logic circuit LA to the logic circuits LB-1 to LB-12 becomes substantially the same as each other, and also the loads applied to the logic circuits LB-1 to LB-12 due to the respective flip-flops FF1-FF6 become substantially the same as each other. Further the phase delays at the respective flip-flops FF1-FF6 from the respective logic circuits LB-1 to LB-12 become substantially the same as each other. This results reduction in the clock skews in the IC chip 14 of the third preferred embodiment.

Furthermore, since the outer control signal line 53 is formed in a ring shape and the inner control signal line 55 is formed in a ring shape, the propagation delays when the control signal propagates from the signal buffer 52 to the signal buffers 54a–54d becomes substantially the same as each other, and also the loads applied to the signal buffers 54a–54d due to the respective flip-flops FF5 and FF6 become substantially the same as each other. Further, the phase delays of the control signal at the respective flip-flops FF5 and FF6 from the signal buffers 54a–54d become substantially the same as each other. This results reduction in the skews of the control signal in the IC chip 14 of the third preferred embodiment.

In the above-mentioned preferred embodiments, since each of the clock signal lines and the control signal line is formed in a ring-shape, the loads of the logic circuits such as the clock buffers, the signal buffers or the like which are applied due to a plurality of flip-flops become substantially the same as each other, and then the phase delays of the clock signal and the control signal at respective flip-flops become substantially the same as each other. This results in reduction in the differences among the propagation delays when the clock signal and the control signal propagate from the external input terminals 1 and 51 to the respective flip-flops, as compared with the IC chips 11 and 12 of the prior art arrangements.

In other words, there can be provided an IC chip having smaller differences among the propagation delays without altering the number of flip-flops within one group of flip-flops, such as setting the numbers of flip-flops within respective groups to be the same as each other, or without altering the ability of the logic circuit for driving load devices such as flip-flops dependent on the number of flip-flops provided within each group of flip-flops, namely, without managing the numbers of flip-flops provided within the respective groups of flip-flops.

Although the present invention has been fully described in connection with the preferred embodiments thereof with reference to the accompanying drawings, it is to be noted that various changes and modifications are apparent to those skilled in the art. Such changes and modifications are to be understood as being included within the scope of the present invention as defined by the appended claims unless they depart therefrom.

What is claimed is:

1. A semiconductor integrated circuit apparatus comprising:
    an external clock input terminal for inputting a clock signal into said semiconductor integrated circuit apparatus;
    a first logic circuit for performing a predetermined process for the clock signal inputted through said external clock input terminal and outputting the processed clock signal;
    a plurality of second logic circuits each for performing a predetermined process for the clock signal outputted from said first logic circuit and outputting the processed clock signal;
    a plurality of flip-flops each for performing a predetermined process in response to the clock signals outputted from said plurality of second logic circuits; and
    an inner clock signal line for electrically connecting said plurality of second logic circuits with said plurality of flip-flops;
    wherein said inner clock signal line is formed in a ring shape in the periphery of said semiconductor integrated circuit apparatus so that said plurality of flip-flops are located within said inner clock signal line.

2. A semiconductor integrated circuit apparatus comprising:
    an external clock input terminal for inputting a clock signal into said semiconductor integrated circuit apparatus;
    a first logic circuit for performing a predetermined process for the clock signal inputted through said external clock input terminal and outputting the processed clock signal;
    a plurality of second logic circuits each for performing a predetermined process for the clock signal outputted from said first logic circuit and outputting the processed clock signal;
    a plurality of flip-flops each for performing a predetermined process in response to the clock signals outputted from said plurality of second logic circuits;
    an inner clock signal line for electrically connecting said plurality of second logic circuits with said plurality of flip-flops, said inner clock signal line being formed in a ring shape; and
    an outer clock signal line for electrically connecting said first logic circuit with said plurality of second logic circuits;
    wherein said outer clock signal line is formed in a ring shape.

3. The semiconductor integrated circuit apparatus as claimed in claim 2, further comprising:
    an external control input terminal for inputting a control signal into said semiconductor integrated circuit apparatus;
    a first signal buffer for processing the control signal inputted through said external control input terminal and outputting the processed control signal;
    a plurality of second signal buffers each for processing the control signal outputted from said first signal buffer and outputting the processed control signal to said plurality of flip-flops;
    an outer control signal line for electrically connecting said first signal buffer to said plurality of second signal buffers, said outer control signal line being formed in a ring shape; and
    an inner control signal line for electrically connecting said plurality of second signal buffers with said plurality of flip-flops, said inner control signal line being formed in a ring shape;
    wherein said plurality of flip-flops performs the predetermined process in response to the control signals outputted from said plurality of second signal buffers in addition to the clock signals outputted from said plurality of second logic circuits.

4. A semiconductor integrated circuit apparatus comprising:
    an external clock input terminal for inputting a clock signal into said semiconductor integrated circuit apparatus;
    a first logic circuit for performing a predetermined process for the clock signal inputted through said external clock input terminal and outputting the processed clock signal;

a plurality of second logic circuits each for performing a predetermined process for the clock signal outputted from said first logic circuit and outputting the processed clock signal;

a plurality of flip-flops each for performing a predetermined process in response to the clock signals outputted from said plurality of second logic circuits;

an inner clock signal line for electrically connecting said plurality of second logic circuits with said plurality of flip-flops, said inner clock signal line being formed in a ring shape;

an external control input terminal for inputting a control signal into said semiconductor integrated circuit apparatus;

a first signal buffer for processing the control signal inputted through said external control input terminal and outputting the processed control signal;

a plurality of second signal buffers each for processing the control signal outputted from said first signal buffer and outputting the processed control signal to said plurality of flip-flops;

an outer control signal line for electrically connecting said first signal buffer to said plurality of second signal buffers, said outer control signal line being formed in a ring shape; and an inner control signal line for electrically connecting said plurality of second signal buffers with said plurality of flip-flops, said inner control signal line being formed in a ring shape;

wherein said plurality of flip-flops performs the predetermined process in response to the control signals outputted from said plurality of second signal buffers in addition to the clock signals outputted from said plurality of second logic circuits.

* * * * *